United States Patent
Zhai

(10) Patent No.: US 12,100,328 B2
(45) Date of Patent: Sep. 24, 2024

(54) DISPLAY PANEL AND DISPLAY DEVICE

(71) Applicant: TIANMA ADVANCED DISPLAY TECHNOLOGY INSTITUTE (XIAMEN) CO., LTD., Xiamen (CN)

(72) Inventor: Yingteng Zhai, Xiamen (CN)

(73) Assignee: TIANMA ADVANCED DISPLAY TECHNOLOGY INSTITUTE (XIAMEN) CO., LTD., Xiamen (CN)

( * ) Notice: Subject to any disclaimer, the term of this patent is extended or adjusted under 35 U.S.C. 154(b) by 0 days.

(21) Appl. No.: 18/466,848

(22) Filed: Sep. 14, 2023

(65) Prior Publication Data

US 2024/0071274 A1    Feb. 29, 2024

(30) Foreign Application Priority Data

Jun. 30, 2023    (CN) .......................... 202310799385.1

(51) Int. Cl.
*G09G 3/20* (2006.01)
*G09G 3/3208* (2016.01)
*G09G 3/3233* (2016.01)
*H03K 19/0185* (2006.01)

(52) U.S. Cl.
CPC ....... *G09G 3/20* (2013.01); *G09G 2300/0465* (2013.01); *G09G 2310/0243* (2013.01); *G09G 2310/0291* (2013.01); *H03K 19/018507* (2013.01)

(58) Field of Classification Search
USPC ....................................................... 345/212
See application file for complete search history.

(56) References Cited

U.S. PATENT DOCUMENTS

| | | | | |
|---|---|---|---|---|
| 2010/0001944 A1* | 1/2010 | Seong | ..................... | G09G 3/342 345/102 |
| 2013/0201172 A1* | 8/2013 | Jeong | ................... | G09G 3/3258 345/82 |
| 2014/0111490 A1* | 4/2014 | Lee | ......................... | G11C 19/28 345/204 |
| 2016/0204165 A1* | 7/2016 | Yang | ................... | G06F 3/04184 345/174 |
| 2017/0206747 A1* | 7/2017 | Miller | ................. | G07F 17/3293 |
| 2018/0130407 A1* | 5/2018 | Zhai | ....................... | G11C 19/28 |
| 2020/0279524 A1* | 9/2020 | Zhang | ...................... | G09G 3/32 |
| 2021/0272510 A1* | 9/2021 | Huitema | ............. | G09G 3/3233 |
| 2022/0384548 A1* | 12/2022 | Keum | ................ | H10K 59/1213 |

FOREIGN PATENT DOCUMENTS

CN    115104146 A    9/2022

* cited by examiner

*Primary Examiner* — Chineyere D Wills-Burns
(74) *Attorney, Agent, or Firm* — KILPATRICK TOWNSEND & STOCKTON LLP

(57) ABSTRACT

A display panel and a display device are provided. The display panel includes a light-emitting element, a first control module, a second control module, and a light-emitting control module. The first control module is connected to a control terminal of the light-emitting control module, the second control module is connected to a first terminal of the light-emitting control module, and a second terminal of the light-emitting control module is connected to the light-emitting element. The first control module selectively controls a light-emitting duration of the light-emitting element, and the second control module selectively provides a driving current for the light-emitting element. At least one of the first control module provides a driving signal to at least one of the second control module.

20 Claims, 15 Drawing Sheets

DISPLAY PANEL AND DISPLAY DEVICE

This application claims priority to Chinese Patent Application No. 202310799385.1, filed with the China National Intellectual Property Administration on Jun. 30, 2023 and entitled "DISPLAY PANEL AND DISPLAY DEVICE", which is incorporated herein by reference in its entirety.

FIELD

The present disclosure relates to the field of display technology, and specifically, to a display panel and a display device.

BACKGROUND

In related art, a Micro-LED usually uses a first control module to control a current pulse width of a light-emitting element through a light-emitting control module, and uses a second control module to control a current output to the light-emitting element. Since the component characteristics of the first control module and the second control module are different, the driving voltages therefor are different, and separate wiring is required to provide driving signals therefor. It requires a large amount of wiring on the panel, which occupies a large area and is not conducive to improving the number of pixels per inch (PPI) of the display panel.

SUMMARY

In order to solve, or at least partially solve, the above problems, the present disclosure provides a display panel and a display device.

In one embodiment of the present disclosure provides a display panel, including: a light-emitting element, a first control module, a second control module, and a light-emitting control module,
- where the first control module is connected to a control terminal of the light-emitting control module, the second control module is connected to a first terminal of the light-emitting control module, and a second terminal of the light-emitting control module is connected to the light-emitting element;
- the first control module selectively controls a light-emitting duration of the light-emitting element, and the second control module selectively provides a driving current for the light-emitting element; and
- at least one of the first control module provides a driving signal to at least one of the second control module.

Another embodiment of the present disclosure further provides a display device, including the above display panel.

BRIEF DESCRIPTION OF DRAWINGS

The accompanying drawings, which are incorporated in and constitute a part of this specification, illustrate embodiments consistent with the disclosure and together with the description serve to explain the principles of the disclosure.

In order to more clearly illustrate the embodiments of the present disclosure, the drawings to be used in the description of the embodiments are briefly introduced hereinafter.

Figure 1:
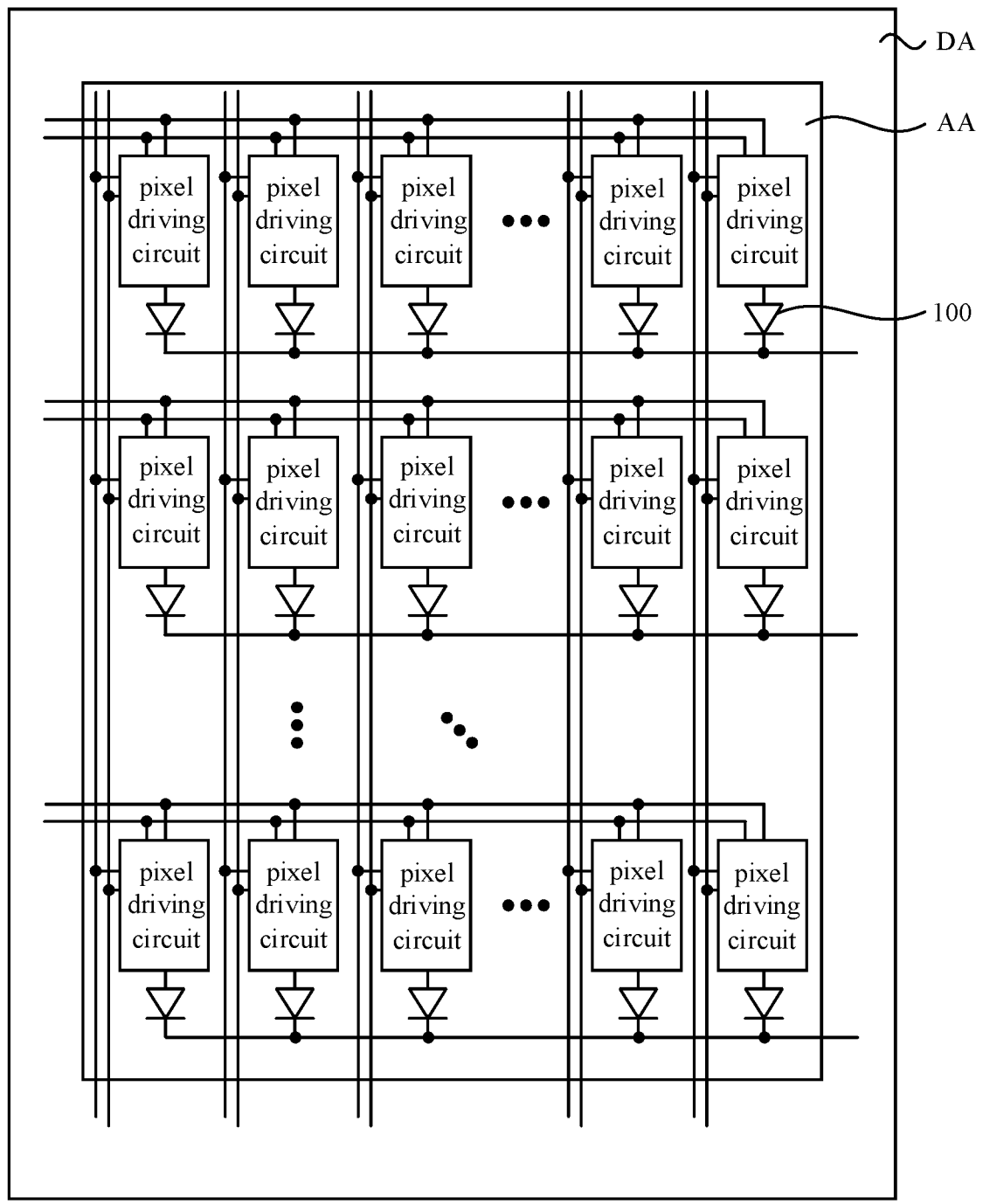
FIG. 1 shows a schematic structural diagram of a display panel in the related art.

The correspondence between legends and components in the drawings are given as follows:

1: display device; 10: display panel; 100: light-emitting element; 110: first control module; 111: scanning signal output terminal; 112: data signal output terminal; 113: power voltage input terminal; 1131: first power voltage input terminal; 1132: second power voltage input terminal; 114: logic signal input terminal; 115: internal logic control unit; 116: digital-to-analog conversion unit; 117: boost unit; 118: level conversion unit; 119: output buffer unit; 110A: first-type first control module; 110B: second-type first control module; 120: second control module; 121: scanning signal input terminal; 122: data signal input terminal; 123: switch control transistor; 124: driving transistor; 125: storage capacitor; 1261: third power voltage input terminal; 1262: fourth power voltage input terminal; 120A: first-type second control module; 120B: second-type second control module; 130: light-emitting control module; 140: substrate.

DETAILED DESCRIPTION OF EMBODIMENTS

In order to more clearly understand the embodiments of the present disclosure, the embodiments of the present disclosure will be further described below. It should be noted that, in the case of no conflict, the embodiments of the present disclosure and the features in the embodiments can be combined with each other.

In the following description, many specific details are set forth in order to fully understand the present disclosure, but the present disclosure can also be implemented in other ways than described here. Apparently, the embodiments in the description are only some, rather than all, of the embodiments of the present disclosure.

Firstly, a display panel and a pixel driving circuit in the related art are exemplarily described with reference to FIG. 1 and FIG. 2, to clarify the existing problems and the improvements made by the embodiments of the present disclosure to solve the problems in the related art.

As shown in FIG. 1, a display panel 10 includes a display area AA and a non-display area DA, and the non-display area DA is arranged on at least one side of the display area AA, for example, the non-display area DA is arranged around the display area AA; light-emitting elements 100 are arranged in an array in the display area AA, and the light emission control is realized by a pixel driving circuit, where the pixel driving circuit and the light-emitting elements 100 can be connected in one-to-one correspondence.

Figure 2:
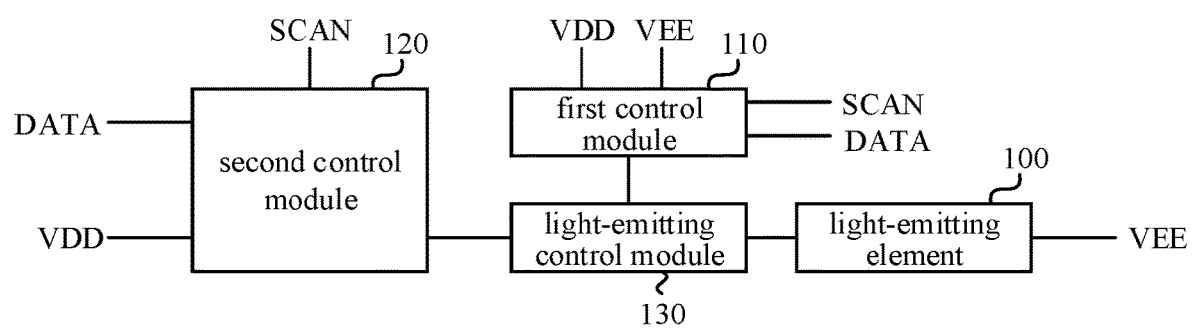
FIG. 2 shows a schematic structural diagram of a pixel driving circuit in a display panel in related art.

Exemplarily, as shown in FIG. 2, the pixel driving circuit in the related art includes a first control module 110, a second control module 120, and a light-emitting control module 130. The first control module 110 and the second control module 120 are separately connected with the light-emitting control module 130, and the light-emitting control module 130 is connected with the light-emitting element 100. The first control module 110 can be a driving integrated circuit (i.e., driving IC) formed based on wafer technology, and the second control module 120 can be a switch circuit formed based on low temperature polysilicon technology. Since the first control module 110 and the second control module 120 require different driving voltages during operation, it is necessary to arrange separate driving signal lines for the first control module 110 and the second control module 120. Thus, for each pixel driving circuit, two sets of driving signal lines need to be provided, as shown in FIG. 1, which requires a large amount of wiring on the panel. The large amount of wiring takes up a lot of space in the panel, which is not conducive to improving the PPI of the display panel.

In order to solve the above problems, a display panel and a display device are provided according to the embodiments of the present disclosure. The display panel includes: a light-emitting element, a first control module, a second control module, and a light-emitting control module. The first control module is connected to a control terminal of the light-emitting control module, the second control module is connected to a first terminal of the light-emitting control module, and a second terminal of the light-emitting control module is connected to the light-emitting element. The first control module selectively controls a light-emitting duration of the light-emitting element, and the second control module selectively provides a driving current for the light-emitting element. At least one of the first control module provides a driving signal to at least one of the second control module. Thus, by using the at least one the first control module to provide the driving signal to at least one of the second control module, the amount of separate wiring for the driving signal of the second control module and the length of the wiring are reduced, to reduce the area occupied by the wiring on the display panel, which is beneficial to saving the total area occupied by the wiring and improving the PPI of the display panel.

The display panel and the display device according to the embodiments of the present disclosure are exemplarily described below with reference to the accompanying drawings.

Figure 3:
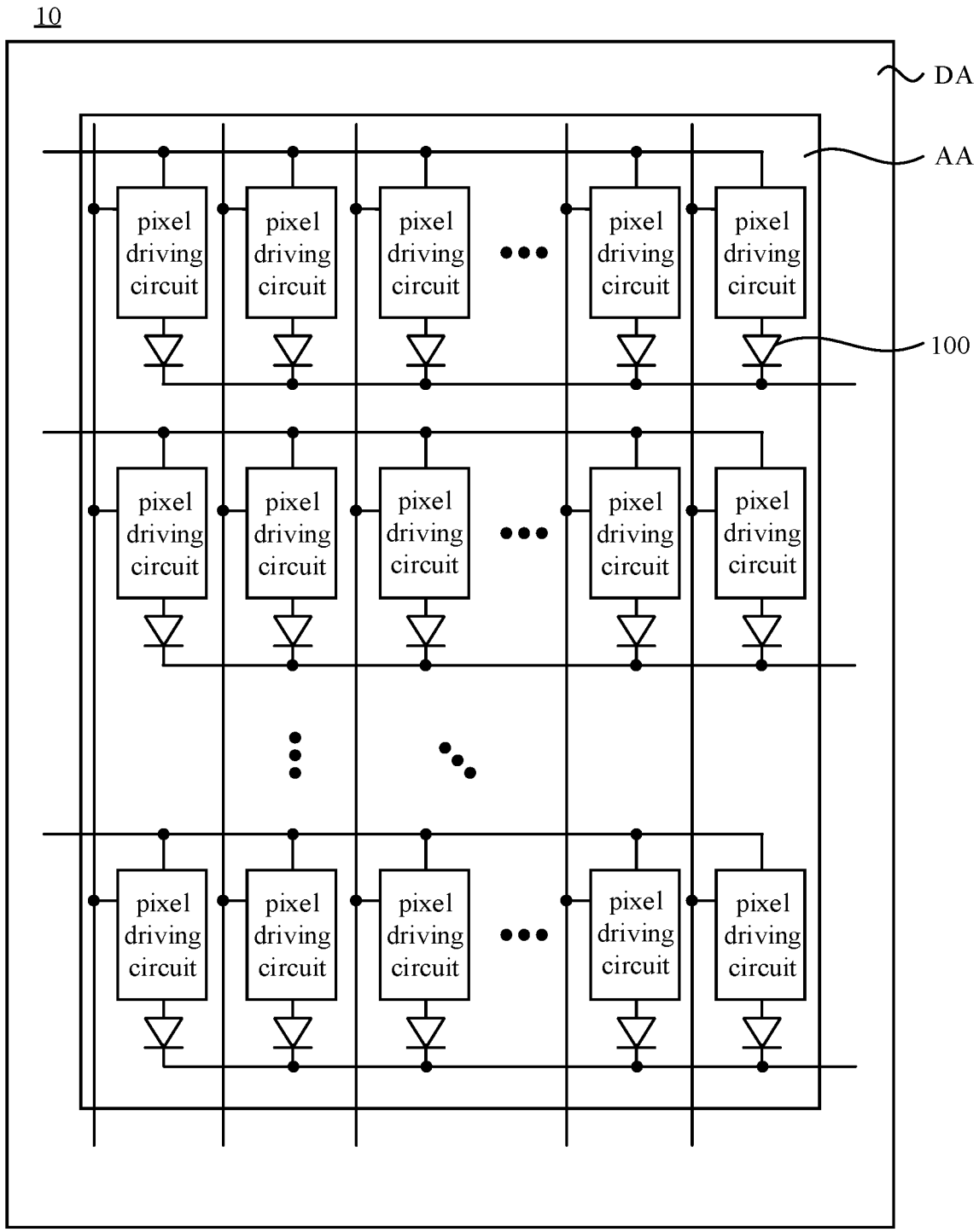
FIG. 3 shows a schematic structural diagram of a display panel according to an embodiment of the present disclosure.
Figure 4:
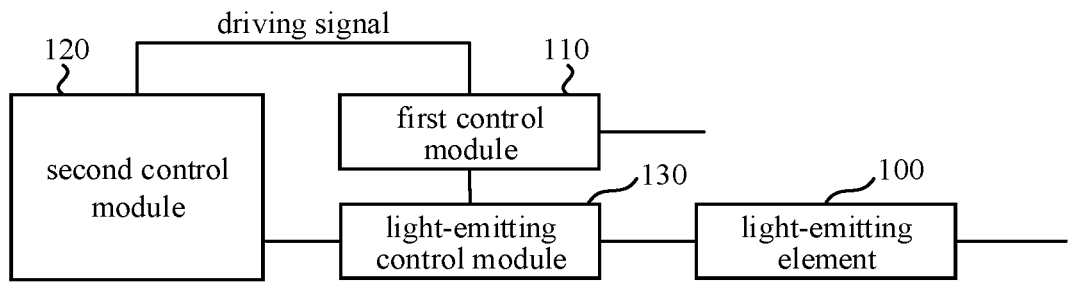
FIG. 4 shows a schematic structural diagram of a pixel driving circuit in a display panel according to an embodiment of the present disclosure.

As shown in FIGS. 3 and 4, the display panel 10 includes a light-emitting element 100, a first control module 110, a second control module 120 and a light-emitting control module 130. The first control module 110 is connected to a control terminal of the light-emitting control module 130, the second control module 120 is connected to a first terminal of the light-emitting control module 130, and a second terminal of the light-emitting control module 130 is connected to the light-emitting element 100. The first control module 110 selectively controls a light-emitting duration of the light-emitting element 100, and the second control module 120 selectively provides a driving current for the light-emitting elements 100. At least one of the first control module 110 provides a driving signal to at least one of the second control module 120.

The display panel 10 can be a Micro-LED display panel, and correspondingly, the light-emitting element 100 is a Micro-LED; or the display panel 10 can be an OLED display panel, and correspondingly, the light-emitting element 100 is an OLED. The display panel 10 can be any other display panel that realizes display based on the control of the light emitting duration and the driving current, which is not limited herein.

The first control module 110 can selectively control a driving duration of the light-emitting element 100. In an embodiment, the first control module 110 can be a driver integrated circuit, that is, a driver chip, such as a Micro-IC.

The second control module 120 can selectively provide the driving current for the light-emitting element 100. In an embodiment, the second control module 120 can be a switch circuit, and the switch circuit can include a thin film transistor (TFT), which is described in detail hereinafter.

The light-emitting control module 130 is controlled by the first control module 110 to switch between on and off to control the light emitting duration of the light-emitting element 100. In an embodiment, pulse width modulation (PWM) technology may be used to adjust a duty ratio to realize adjustment of on-to-off ratio, to realize the control of the light-emitting duration. In other embodiments, the light-emitting duration may be controlled by other methods know to those in the art, which is not limited here.

At least one of the first control module 110 is connected to at least one of the second control module 120, and the driving signal can be provided by the first control module 110 to the second control module 120. In this way, the at least one of the second control module 120 that is provided with the driving signal by the first control module 110 does not need to be provided with a separate driving signal line, to reduce the amount of separate wiring for the second control module 120 and the length of the wiring, and saving the area of the display panel occupied by the wiring, which is conducive to improving the PPI of the display panel.

At least one of the first control module 110 provides a driving signal to at least one of the second control module 120 may include: at least one but less than all of the first control module 110 provides a driving signal to the second control module 120, and the rest of the first control module 110 does not provide a driving signal to the second control module 120; at least one but less than all of the second control module 120 is provided with a driving signal by the first control module 110, and the rest of the second control module 120 is directly provided with a driving signal from the outside; all the first control module 110 provides a driving signal to the second control module 110; all the second control module 120 is provided with a driving signal by the first control module 110.

Referring to FIGS. 3 and 4, the display panel 10 is provided with multiple pixel driving circuits arranged in an array. That is, the display panel 10 includes multiple first control modules 110 and multiple second control modules 120. One of the multiple second control modules 120 may be provided with a driving signal by the first control module 110, and a separate driving signal line is not required for the second control module 120; or, a row or a column of second control modules 120 are provided with driving signals by first control modules 110, and separate driving signal lines are not required for the row or column of second control modules 120; or, all the second control modules 120 are provided with driving signals by the first control modules 110, and a separate driving line is not required for any of the second control modules 120. Compared with FIG. 1, the number of separately-arranged driving signal lines is reduced by half in FIG. 3.

According to the above embodiment, the amount of separate wiring for the second control modules 120 can be reduced; in addition, since the second control module is provided with a driving signal by the first control module without any external leads, the length of the wiring is reduced, to reduce the area occupied by the wiring on the display panel, which is beneficial to saving the total area occupied by the wiring and improving the PPI of the display panel.

Figure 5:
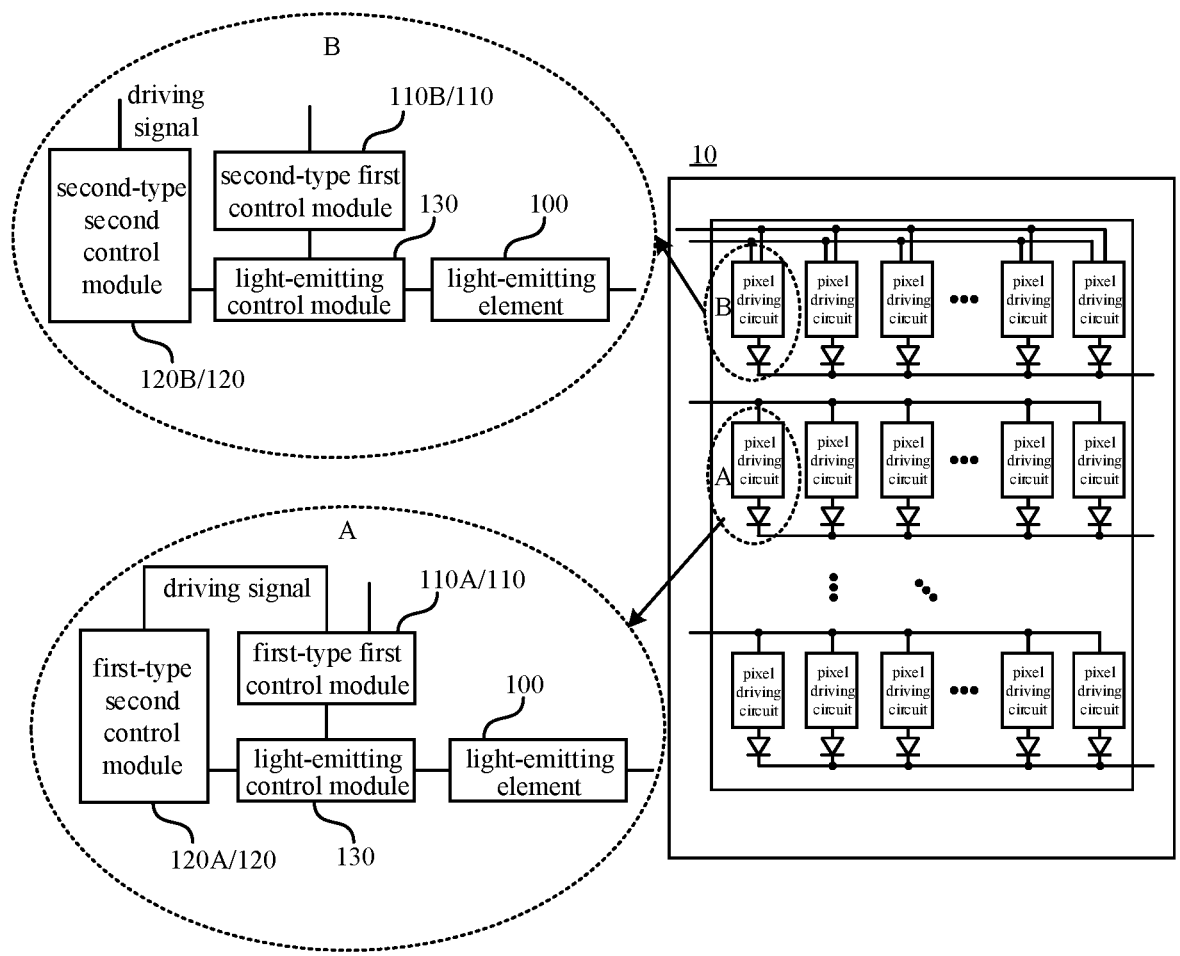
FIG. 5 shows a schematic structural diagram of a display panel according to an embodiment of the present disclosure.

In some embodiments, a relationship between the first control module, the second control module and external driving signal lines in a display panel is shown in FIG. 5, for example.

Referring to FIG. 5, in the display panel 10, the first control module 110 includes a first-type first control module 110A. The first-type first control module 110A is connected to the second control module 120, and is configured to perform voltage conversion to generate the driving signal suitable for the second control module 120, where reference can be made to the structure in circle A in FIG. 5.

The first-type first control module 110A is a first control module 110 capable of providing a driving signal to the second control module 120. The first-type first control module 110A can not only control the light-emitting duration of the light-emitting element 100, but also provide the second control module 120 with a driving signal to save the second control module 120 from connecting to an external lead, to reduce the number of driving signal lines for the second control module 120.

In other embodiments, as shown in FIG. 5, the first control module 110 further includes a second-type first control module 110B. The second-type first control module 110B is not connected to the second control module 120 and is only configured to control the light-emitting duration of the light-emitting element 100, and the corresponding second control module 120 is provided with a driving signal directly from the outside, where reference can be made to the structure in circle B in FIG. 5.

In some embodiments, continuing with FIG. 5, similar to the first control module 110A, the second control module 120 includes a first-type second control module 120A. The first-type second control module 120A is connected to the first-type first control module 110A, and is configured to provide a driving current for the light-emitting element 100 in response to a driving signal provided by the first-type first control module 110A.

The first-type second control module 120A is a second control module 120 that is provided with a driving signal by the first control module 110. The first-type second control module 120A is connected to the first-type first control module 110A, receives the driving signal provided by the first-type first control module 110A, and provides, in response to the driving signal, the driving current for the light-emitting element 100. Thus, the first-type second control module 120A directly draws a lead from the first-type second control module 120A, instead of from the outside, to reduce the amount of wiring.

In other embodiments, as shown in FIG. 5, the second control module 120 further includes a second-type second control module 120B, and the second-type second control module 120B receives a driving signal from the outside, and provides, in response to this driving signal from the outside, a driving current for the light-emitting element 100, where reference can be made to the structure in circle B in FIG. 5.

It should be noted that, in the display panel 10 according to the embodiments of the present disclosure, the first control module 110 may only include the first-type first control module 110A, or include both the first-type first control module 110A and the second-type first control module 110B. Correspondingly, the second control module 120 may only include the first-type second control module 120A, or include both the first-type second control module 120A and the second-type second control module 120B, which may be configured according to requirements on the display panel 10 and is not limited herein.

Figure 6:
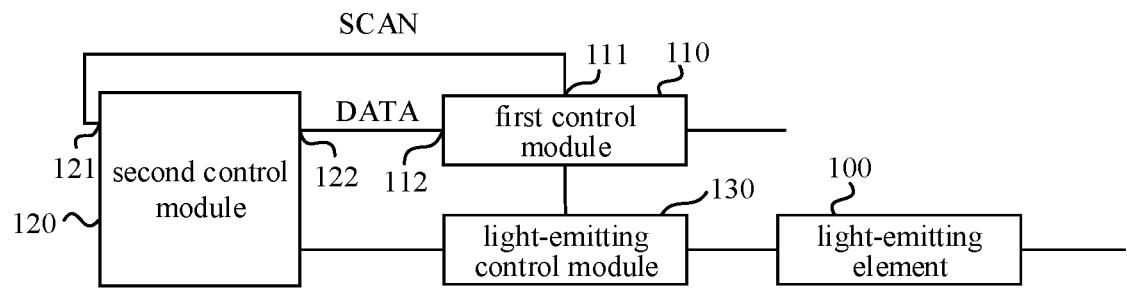
FIG. 6 shows a schematic structural diagram of a display panel according to an embodiment of the present disclosure.
Figure 7:
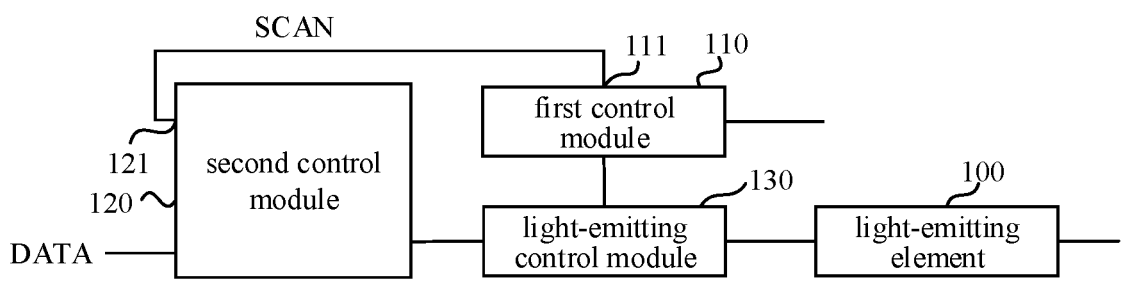
FIG. 7 shows a schematic structural diagram of a display panel according to an embodiment of the present disclosure.
Figure 8:
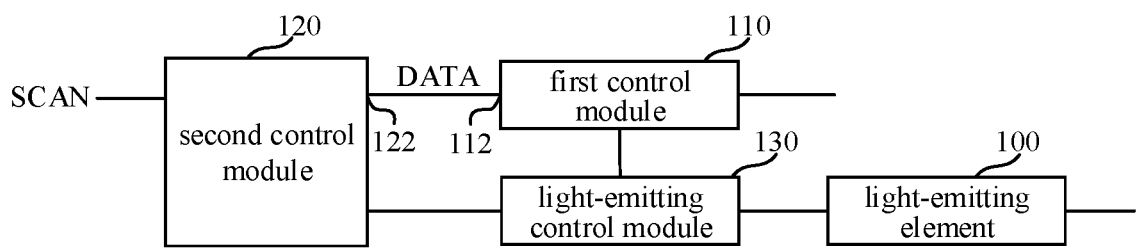
FIG. 8 shows a schematic structural diagram of a display panel according to an embodiment of the present disclosure.

In some embodiments, as shown in FIGS. 6 to 8, at least one of the first control module 110 includes at least one of a scanning signal output terminal 111 and a data signal output terminal 112, and at least one of the second control module 120 includes at least one of a scanning signal input terminal 121 and a data signal input terminal 122. The scanning signal output terminal 111 is connected with the scanning signal input terminal 121, and the data signal output terminal 112 is connected with data signal input terminal 122. The first control module 110 is configured to obtain, by voltage boosting, a scanning signal SCAN for driving the second control module 120, output the scanning signal SCAN through the scanning signal output terminal 111, and transmit the scanning signal SCAN to the scanning signal input terminal 121 of the second control module 120; and/or, the first control module 110 is configured to obtain, by voltage boosting, a data signal DATA for driving the second control module 120, output the data signal DATA through the data signal output terminal 112, and transmit the data signal DATA to the data signal input terminal 122 of the second control module 120.

The scanning signal output terminal 111 and the scanning signal input terminal 121 may be directly connected, for example, through a first wire, or electrically connected by using other connection structures. Similarly, the data signal output terminal 112 and the data signal input terminal 122 may be directly connected, for example, through a second wire, or electrically connected by using other connection structures, which is not limited here.

Exemplarily, as shown in FIG. 6, in the display panel 10, the first control module 110 includes a scanning signal output terminal 111 and a data signal output terminal 112, and the second control module 120 includes a scanning signal input terminal 121 and a data signal input terminal 122. The scanning signal output terminal 111 is connected to the scanning signal input terminal 121, and the data signal output terminal 112 is connected to the data signal input terminal 122. The first control module 110 is configured to obtain, by voltage boosting, a scanning signal SCAN for driving the second control module 120, output the scanning signal SCAN through the scanning signal output terminal 111, and transmit the scanning signal SCAN to the scanning signal input terminal 121 of the second control module 120. The first control module 110 is also configured to obtain, by voltage boosting, a data signal DATA for driving the second control module 120, output the data signal DATA through the data signal output terminal 112, and transmit the data signal DATA to the data signal input terminal 122 of the second control module 120.

Exemplarily, as shown in FIG. 7, in the display panel 10, the first control module 110 includes a scanning signal output terminal 111, the second control module 120 includes a scanning signal input terminal 121, and the scanning signal output terminal 111 and the scanning signal input terminal 121 are connected with each other. The first control module 110 is configured to obtain, by voltage boosting, a scanning signal SCAN for driving the second control module 120, output the scanning signal SCAN through the scanning signal output terminal 111, and transmit the scanning signal SCAN to the scanning signal input terminal 121 of the second control module 120. The second control module 120 is directly provided with a data signal DATA from the outside.

Exemplarily, as shown in FIG. 8, in the display panel 10, the first control module 110 includes a data signal output terminal 112, the second control module 120 includes a data signal input terminal 122, and the data signal output terminal 112 and the data signal input terminal 122 are connected with each other. The first control module 110 is configured to obtain, by voltage boosting, a data signal DATA for driving the second control module 120, output the data signal DATA through the data signal output terminal 112, and transmit the data signal DATA to the data signal input terminal 122 of the second control module 120. The second control module 120 is directly provided with a scanning signal SCAN from the outside.

Figure 9:
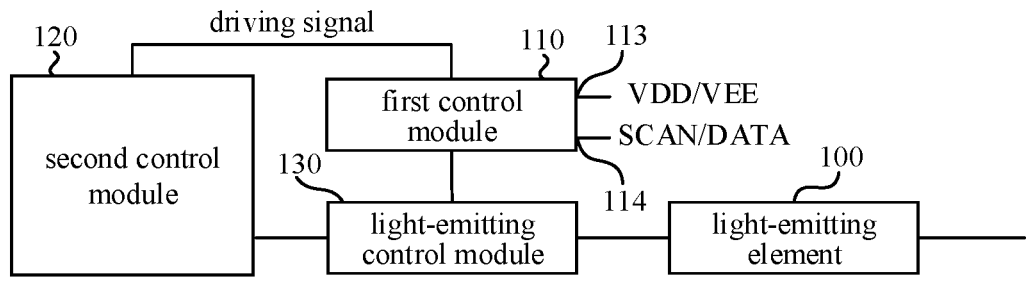
FIG. 9 shows a schematic structural diagram of a first control module in a display panel according to an embodiment of the present disclosure.

In some embodiments, as shown in FIG. 9, the first control module 110 includes a power voltage input terminal 113 and a logic signal input terminal 114. The power voltage input terminal 113 receives a power voltage suitable for the first control module 110, and the logic signal input terminal 114 receives a digital driving signal suitable for the first control module 110. The first control module 110 is configured to generate a driving signal suitable for the second control module 120 based on the power voltage and the digital driving signal suitable for the first control module 110.

The first control module 110 receives the power voltage through the power voltage input terminal 113. Exemplarily, the power voltage may include a positive voltage VDD and a negative voltage VEE. In an actual circuit structure, the power voltage input terminal 113 may include a terminal for the positive voltage VDD and a terminal for the negative voltage VEE.

The first control module 110 is a digital driving module, and receives the digital driving signal through the logic signal input terminal 114. Exemplarily, the digital driving signal may be a signal expressed as 1/0; for example, 1 represents a high level signal and 0 represents a low level signal. The digital driving signal may include at least one of the scanning signal SCAN and the data signal DATA, which is not limited herein.

In an embodiment of the present disclosure, the second control module is an analog driving module, and the first control module 110 performs digital-to-analog conversion to generate the driving signal suitable for the second control module 120. In an embodiment, the first control module 110 may generate the driving signal suitable for the second control module 120 based on the power voltage and digital driving signal as received, and the first control module 110 can be directly used to provide the driving signal to the second control module 120, without the need to separately draw a wire from the outside to the second control module 120, to reduce the amount of wiring and the area occupied by the wiring, which is beneficial to improving the PPI of the display panel.

Figure 10:
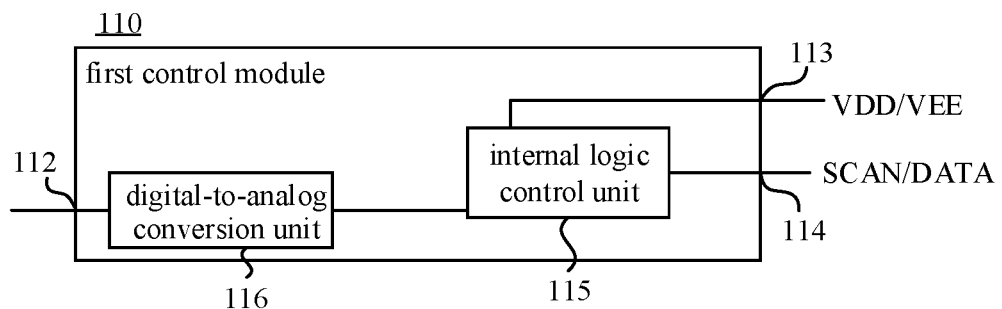
FIG. 10 shows a schematic structural diagram of a first control module according to an embodiment of the present disclosure.

In some embodiment, as shown in FIG. 10, the first control module 110 further includes: an internal logic control unit 115 and a digital-to-analog conversion unit 116. An input terminal of the internal logic control unit 115 is connected to the power voltage input terminal 113, and another input terminal of the internal logic control unit 115 is connected to the logic signal input terminal 114. The digital-to-analog conversion unit 116 is connected between the internal logic control unit 115 and the data signal output terminal 112 of the first control module 110. The digital-to-analog conversion unit 116 is configured to convert, under the control of the internal logic control unit 115, at least one of the digital driving signal suitable for the first control module 110 into at least one of the driving signal suitable for the second control module 120.

The driving signals of the first control module 110 and the second control module 120 include scanning signals and data signals. The driving signal received by the first control module 110 is a digital driving signal, and the digital-to-analog conversion unit 116 is configured to convert the digital driving signal suitable for the first control module 110 into the driving signal suitable for the second control module 120. The at least one of the driving signal in this embodiment may be a digital signal, and the driving signal output from the data signal output terminal 112 is an analog signal.

In the disclosure, in order to distinguish the driving signals for the first control module 110 and the second control module 120, the driving signal for the first control module 110 is represented by a first scanning signal SCAN_1 and a first data signal DATA_1, and the driving signal for the second control module 120 is represented by a second scanning signal SCAN_2 and a second data signal DATA_2.

Figure 11:
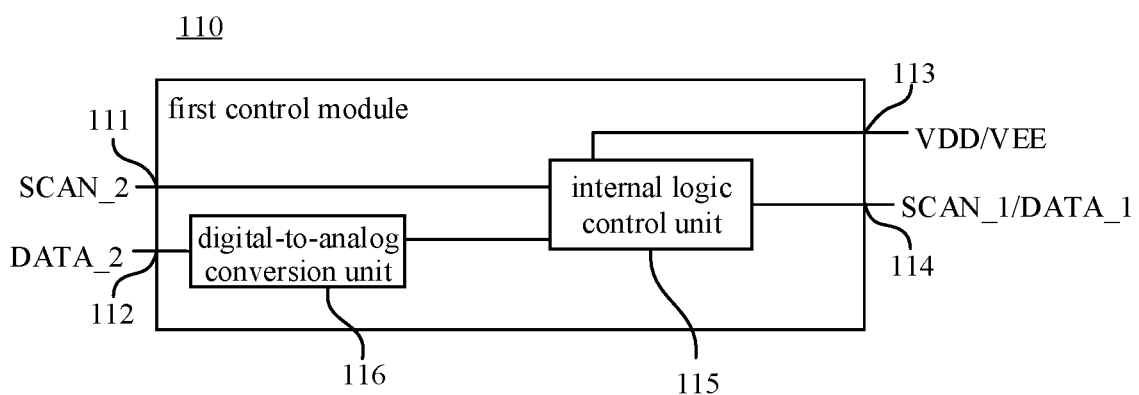
FIG. 11 shows a schematic structural diagram of a first control module according to an embodiment of the present disclosure.

In some embodiments, as shown in FIG. 11, for the first control module 110, the digital driving signal includes at least one of the first scanning signal SCAN_1 and the first data signal DATA_1. The digital-to-analog conversion unit 116 is configured to convert the first data signal DATA_1 suitable for the first control module 110 into a second data signal DATA_2 suitable for the second control module 120 under the control of the logic control unit 115, and outputs the second data signal DATA_2 through the data signal output terminal 112; and/or, the internal logic control unit 115 is configured to generate a second scanning signal SCAN_2 suitable for the second control module 120 based on the scanning signal and the power voltage. The driving signal includes at least one of the second scanning signal SCAN_2 and the second data signal DATA_2.

In some embodiments, as shown in FIG. 11, an output terminal of the internal logic control unit 115 is connected to the scanning signal output terminal 111 of the first control module 110.

The internal logic control unit 115 generates a second scanning signal SCAN_2 suitable for the second control module 120 based on the scanning signal and the power voltage, and outputs the second scanning signal SCAN_2 through the scanning signal output terminal 111. Exemplarily, by selecting the first control module 110, the power voltages of the first control module 110 and the second control module 120 are equal, the power voltage suitable for the second control module is input to the first control module 110, and the first control module 110 operates with the power voltage, and directly outputs the power voltage to the second control module 120 to control the second control module 120 to provide the driving current to the light-emitting element 100.

Figure 12:
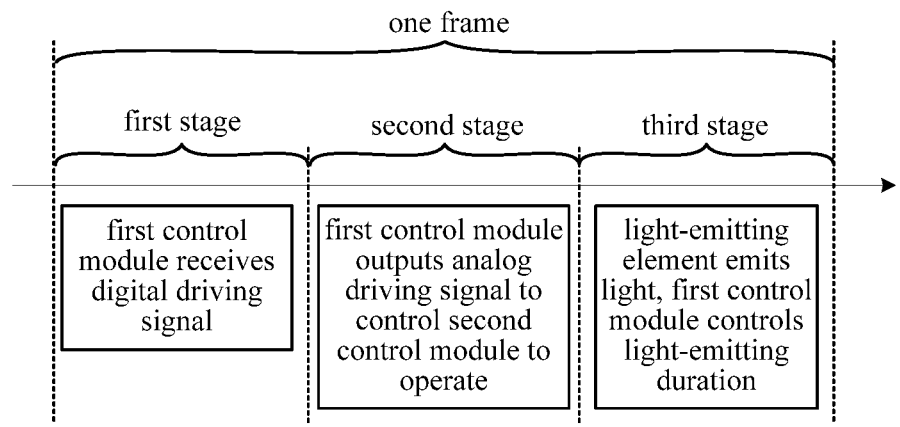
FIG. 12 shows a timing sequence diagram of operation of a display panel according to an embodiment of the present disclosure.

Exemplarily, FIG. 12 shows a timing sequence diagram of operation of a display panel according to an embodiment of the present disclosure. Referring to FIG. 12, within the timing sequence of the operation of the display panel, one frame may be divided into three stages. In the first stage, the first control module 110 receives the digital driving signal and converts the digital driving signal into an analog driving signal suitable for the second control module 120; in the second stage, the first control module 110 outputs the analog driving signal to the second control module 120 to control the second control module 120 to provide the driving current for the light-emitting element 100; in the third stage, the light-emitting element 100 emits light, and the duration of light emission of the light-emitting element 100 is controlled by the first control module 110.

Figure 13:
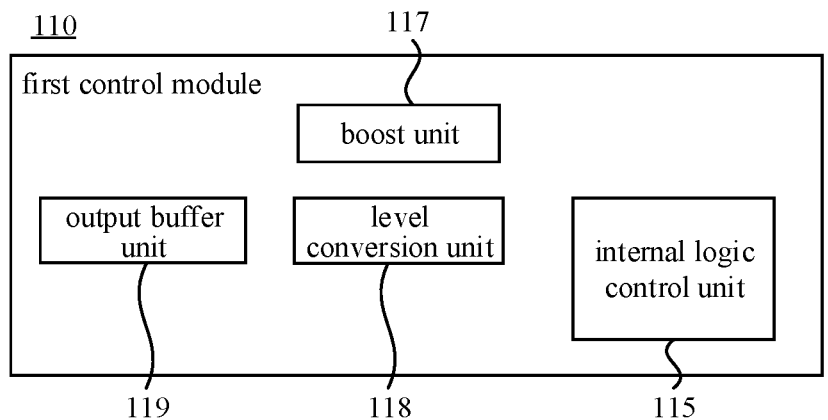
FIG. 13 shows a schematic structural diagram of a first control module according to an embodiment of the present disclosure.

In some embodiments, as shown in FIG. 13, the first control module 110 further includes: an internal logic control unit 115, a boost unit 117, a level conversion unit 118, and an output buffer unit 119. The boost unit 117 is configured to obtain an intermediate voltage by boosting the power voltage; the level conversion unit 118 is configured to convert, under the control of the internal logic control unit 115, the intermediate voltage into a voltage for the driving signal; the output buffer unit 119 is configured to amplify the to-be-processed voltage, to obtain the driving signal.

In the first control module 110 of the display panel according to this embodiment, the functions that the internal logic control unit 115 can realize are different from the functions that can be realized by the internal logic control unit 115 in the embodiments in FIG. 10 and FIG. 11. In this embodiment, the internal logic control unit 115 is configured to generate a low-voltage control signal based on the received power voltage and/or driving signal, and output the low-voltage control signal to the level conversion unit 118.

The boost unit 117 is configured to boost the power voltage (VDD/VEE) for the first control module 110 to generate an intermediate voltage with a constant level. Compared with the power voltage, the intermediate voltage is a high-level voltage, to provide the level conversion unit 118 with a reference level. The level conversion unit 118 is configured to convert the constant high level into a required high level, i.e., the to-be-processed voltage, according to the intermediate voltage provided by the boost unit 117. In this way, the low-voltage control signal output by the internal logic control unit 115 is converted into a high-voltage control signal suitable for the second control module 120. As the high-voltage control signal is too weak to drive the load, in the embodiment, the output buffer unit 119 performs power amplification processing on the high-voltage control signal to realize precise control of the second control module 120.

Figure 14:
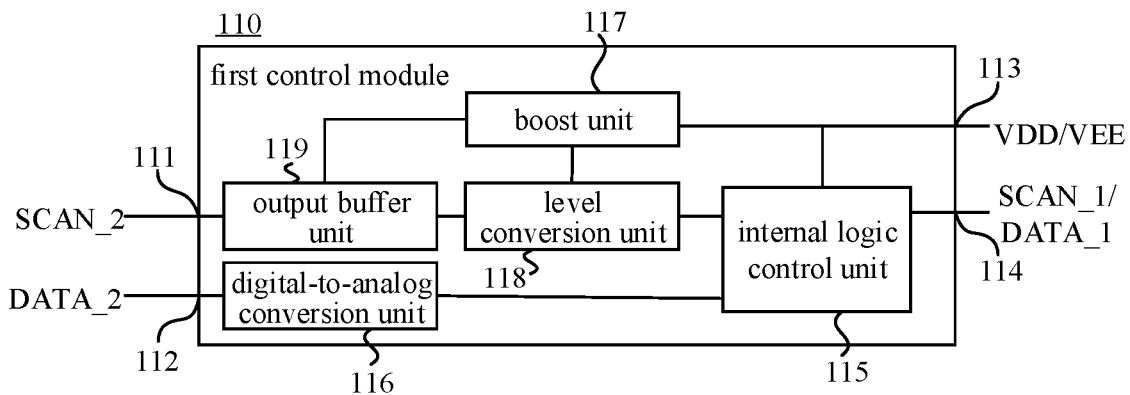
FIG. 14 shows a schematic structural diagram of a first control module according to an embodiment of the present disclosure.

In some embodiments, as shown in FIG. 14, an input terminal of the boost unit 117 is connected to the power voltage input terminal 113, an output terminal of the internal logic control unit 115 is connected to an input terminal of the level conversion unit 118, an output terminal of the boost unit 117 is connected to another input terminal of the level conversion unit 118, another output terminal of the boost unit 117 is connected to an input terminal of the output buffer unit 119, an output terminal of the level conversion unit 118 is connected to another input terminal of the output buffer unit 119, and an output terminal of the output buffer unit 119 is connected to the scanning signal output terminal 111 of the first control module 110.

The boost unit 117 boosts the power voltage (VDD/VEE) suitable for the first control module 110 to generate the intermediate voltage with a constant level. The level conversion unit 118 converts the constant high level into the required high level, that is, the intermediate voltage is converted into the to-be-processed voltage to convert the low-voltage control signal output by the internal logic control unit 115 into the high-voltage control signal. The output buffer unit 119 performs power amplification processing on the high-voltage control signal, and outputs the second scanning signal SCAN_2 through the scanning signal output terminal 111.

In some embodiments, as shown in FIG. 14, the first control module 110 further includes a digital-to-analog conversion unit 116. The digital-to-analog conversion unit 116 is connected between the internal logic control unit 115 and the data signal output terminal 112 of the first control module 110. The digital-to-analog conversion unit 116 is configured to convert the first data signal DATA_1 suitable for the first control module 110 into the second data signal DATA_2 suitable for the second control module 120 under the control of the internal logic control unit 115.

Figure 15:
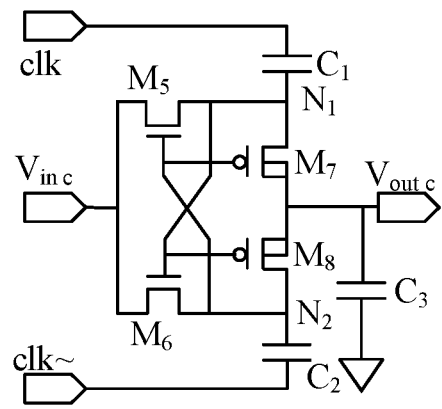
FIG. 15 shows a schematic structural diagram of a boost unit in a display panel according to an embodiment of the present disclosure.

In some embodiments, as shown in FIG. 15, the boost unit 117 includes a charge pump.

Referring to FIG. 14 and FIG. 15, a clock for the charge pump may be generated internally by the first control module 110.

It should be noted that FIG. 15 only exemplarily shows one circuit implementation structure of the boost unit 117, but does not constitute a limitation to the display panel according to the embodiments of the present disclosure.

In other embodiments, the boost unit 117 may be configured as other circuits or components with a boost function, which is not limited herein.

Figure 16:
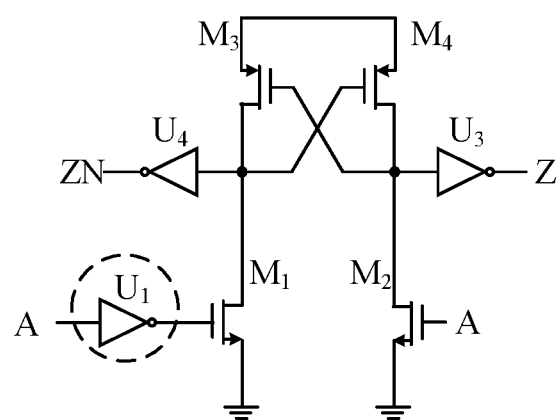
FIG. 16 shows a schematic structural diagram of a level conversion unit in a display panel according to an embodiment of the present disclosure.

In some embodiments, as shown in FIG. 16, the level conversion unit 118 includes a level converter.

It should be noted that FIG. 16 only exemplarily shows one circuit structure of the level conversion unit 118, but does not constitute a limitation to the display panel according to the embodiments of the present disclosure.

In other embodiment, the level conversion unit 118 may be configured as other circuits or components with a voltage conversion function t, which is not limited herein.

Figure 17:
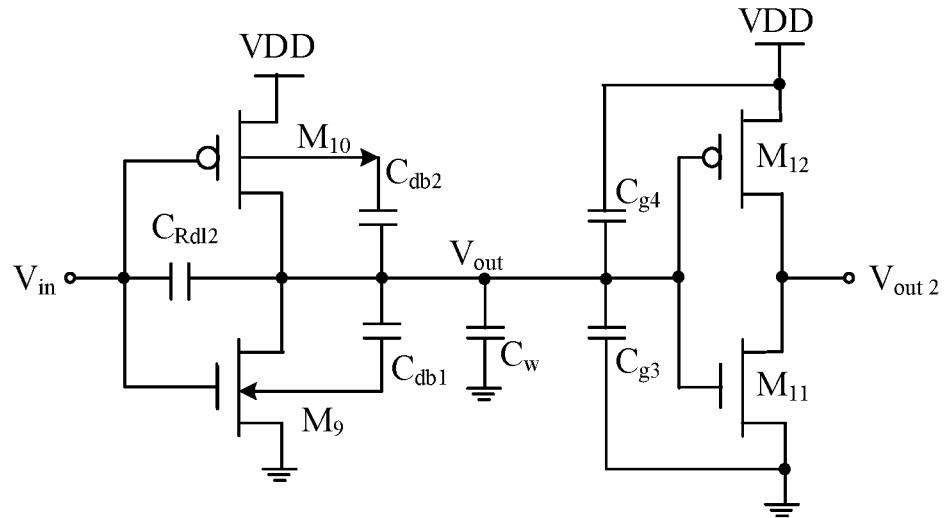
FIG. 17 shows a schematic structural diagram of an output buffer unit in a display panel according to an embodiment of the present disclosure.

In some embodiments, as shown in FIG. 17, the output buffer unit 119 includes a power amplifier.

The output buffer unit 119 includes two complementary metal oxide semiconductor (CMOS) inverters connected in series with each other.

It should be noted that FIG. 17 only exemplarily shows one circuit structure of the output buffer unit 119, but does not constitute a limitation to the display panel according to the embodiments of the present disclosure.

In other embodiments, the output buffer unit 119 may be configured as other circuits or components with a power amplification function, which is not limited herein.

Figure 18:
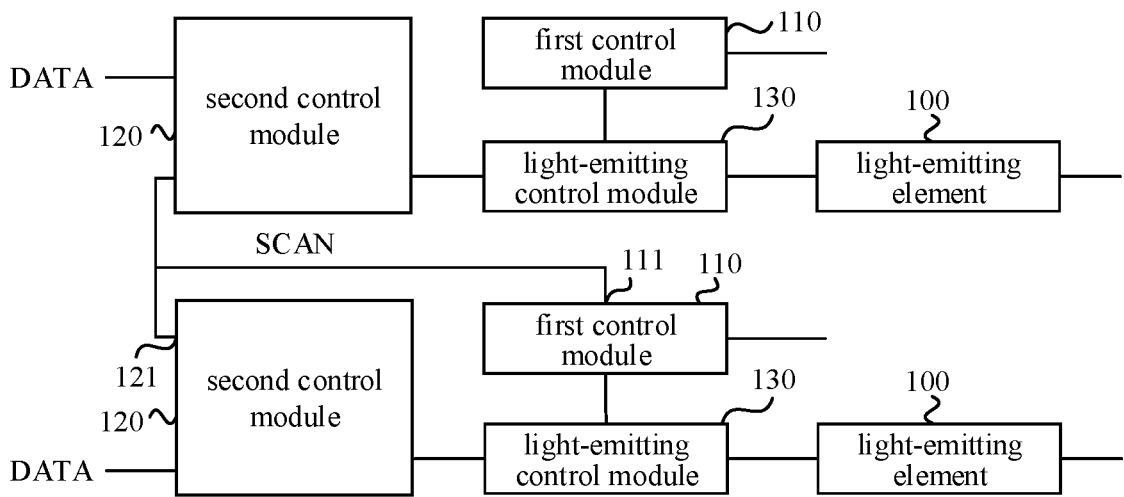
FIG. 18 shows a schematic structural diagram of a display panel according to an embodiment of the present disclosure.
Figure 19:
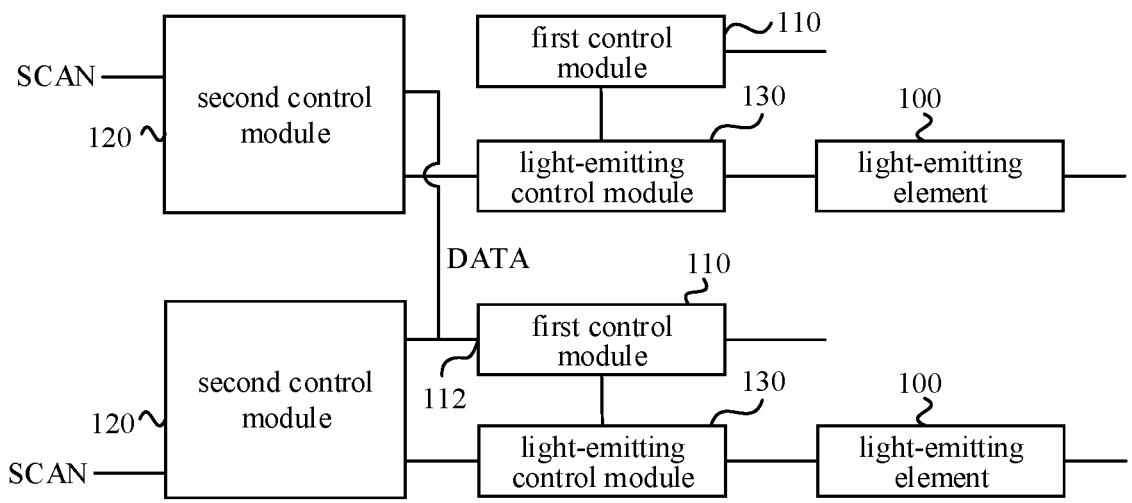
FIG. 19 shows a schematic structural diagram of a display panel according to an embodiment of the present disclosure.
Figure 20:
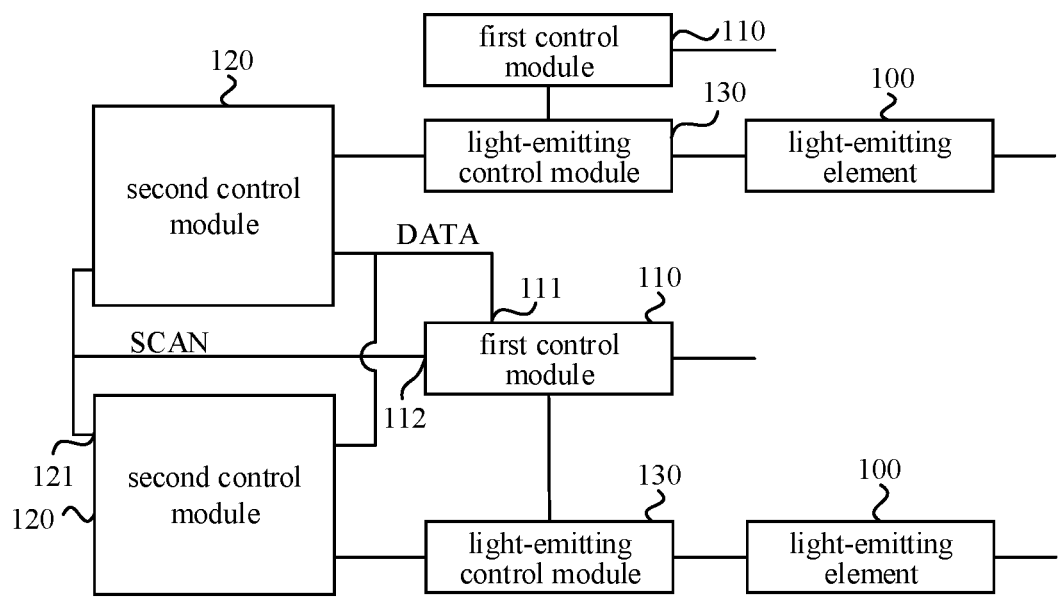
FIG. 20 shows a schematic structural diagram of a display panel according to an embodiment of the present disclosure.

In some embodiments, as shown in FIGS. 18 to 20, one first control module 110 is configured to provide the scanning signal SCAN to two second control modules 120; and/or, one first control module 110 is configured to provide the data signal DATA to two second control modules 120.

In a case that the first control module 110 and the second control module 120 are connected, the first control module 110 provides at least one of the scanning signal and the data signal to the second control module 120, and there is a one-to-one correspondence or a one-to-many correspondence between the first control module 110 and the second control module 120, which is not limited here.

Exemplarily, as shown in FIG. 18, in the display panel, one first control module 110 provides the scanning signal SCAN to two second control modules 120, and the two second control modules 120 are directly provided with data signals DATA from the outside.

Exemplarily, as shown in FIG. 19, in the display panel, one first control module 110 provides the data signal DATA to two second control modules 120, and the two second control modules 120 are directly provided with scanning signals SCAN from the outside.

Exemplarily, as shown in FIG. 20, in the display panel, one first control module 110 can provide the scanning signal SCAN to two second control modules 120. In addition, the first control module 110 can also provide the data signal DATA to two second control modules 120. The two second control modules 120 receiving the scanning signal SCAN and the two second control modules 120 receiving the data signal DATA can be identical, partially identical or different, which is not limited herein.

It should be noted that FIG. 18 to FIG. 20 only exemplarily show that one first control module 110 provides the scanning signal SCAN and/or data signal DATA to two second control modules 120, but they do not constitute a limitation to the display panel according to the embodiments of the present disclosure.

In other embodiments, one first control module 110 may provide three, four or more second control modules 120 with the scanning signal SCAN and/or the data signal DATA, which is not limited herein.

Figure 21:
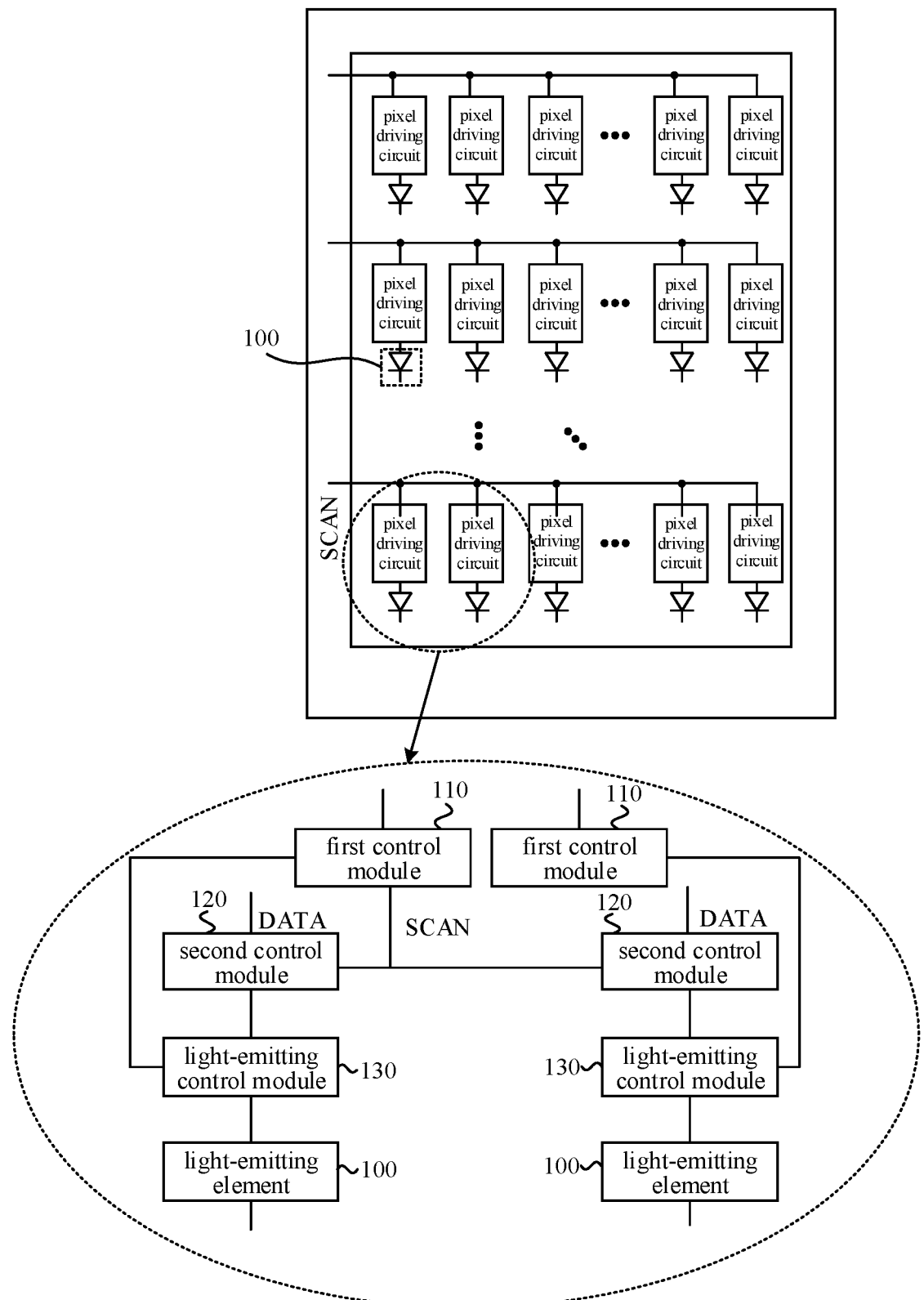
FIG. 21 shows a schematic structural diagram of a display panel according to an embodiment of the present disclosure.
Figure 22:
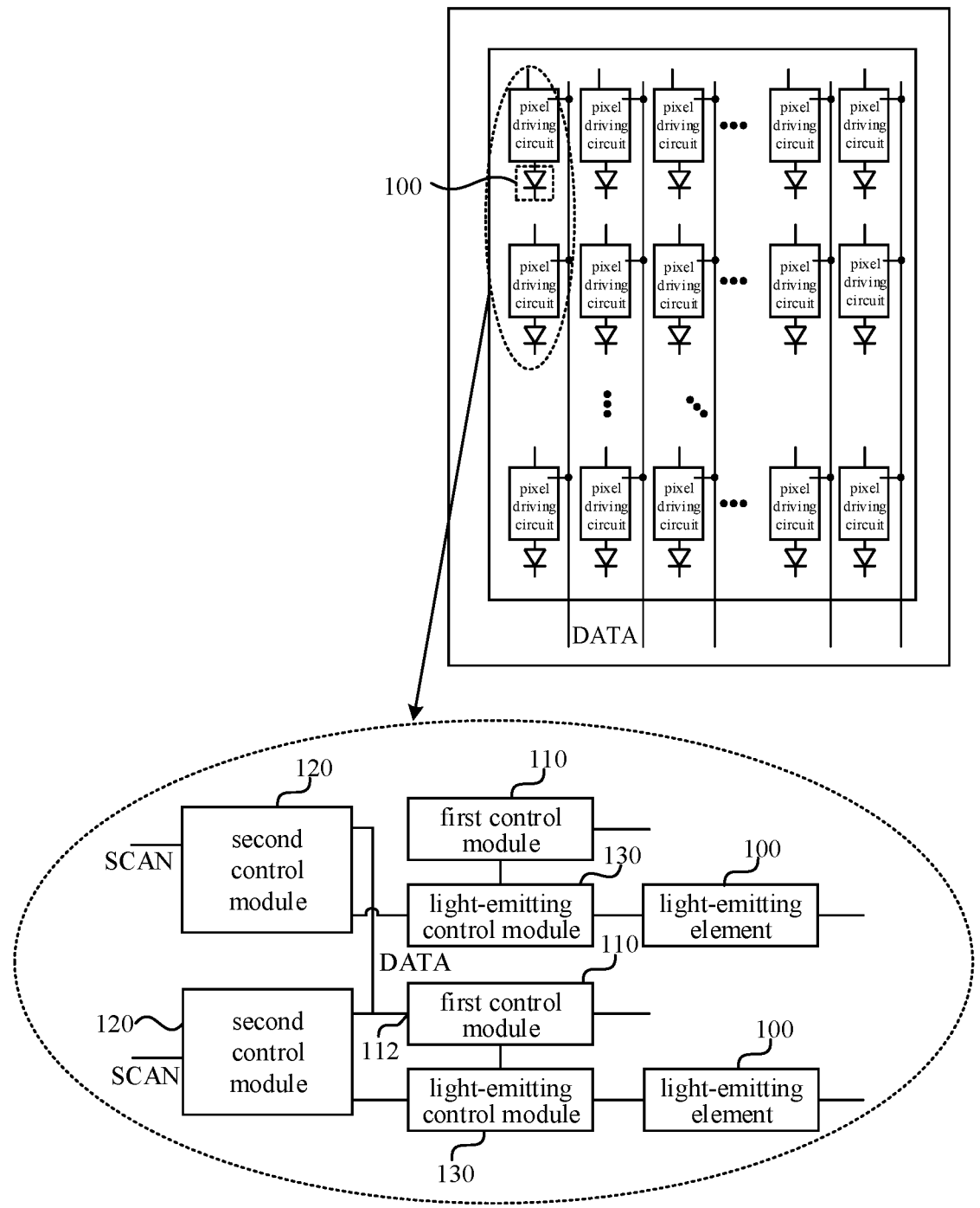
FIG. 22 shows a schematic structural diagram of a display panel according to an embodiment of the present disclosure.

In some embodiments, as shown in FIG. 21 and FIG. 22, the light-emitting elements 100 are arranged in rows and columns; correspondingly, the pixel driving circuits are generally arranged in rows and columns. At least one of the second control modules 120 in the same row is provided with the scanning signal SCAN by one first control module 110; and/or, at least one of the second control modules 120 in the same row is provided with the data signal DATA by one first control module 110.

At least one second control modules 120 among the second control modules 120 in the same row is provided with the scanning signal SCAN by the same first control module 110; and/or, at least one second control modules 120 among the second control modules 120 in the same column is provided with the data signal by the same first control module 110.

Exemplarily, as shown in FIG. 21, the pixel driving circuits in the bottom row of the display panel 10 are taken as an example, and all the second control modules 120 in this row are provided with the scanning signal SCAN by the same first control module 110. In other embodiments, some of the second control modules 120 in the same row may be provided with the scanning signal SCAN by the same first control module 110, and the rest of the second control modules 120 may each be provided with the scanning signal SCAN by other first control modules 110, or by an external lead. The second control modules 120 in this row may each be provided with the data signal DATA by the first control module 110, or by an external lead.

Exemplarily, as shown in FIG. 22, the leftmost column of pixel driving circuits on the display panel 10 are taken as an example, and all the second control modules 120 in this column are provided with the data signal DATA by the same first control module 110. In other embodiments, some of the second control modules 120 in the same column may be provided with the data signal DATA by the same first control module 110, and the rest of the second control modules 120 may each be provided with the data signal DATA by other first control modules 110, or by an external lead. The second control modules 120 in this column may each be provided with the scanning signal SCAN by the first control module 110, or by an external lead.

It should be noted that the partial enlarged structure in FIG. 21 only exemplarily shows that the modules in a pixel driving circuit are generally arranged along a vertical direction (that is, a column-wise direction), and the partial enlarged structure in FIG. 22 only exemplarily shows that the modules in a pixel driving circuit are generally arranged along a horizontal direction (that is, a row-wise direction), but they do not constitute a limitation to the display panel according to the embodiments of the present disclosure. In other embodiments, the relative spatial positional relationship of the modules in the pixel driving circuit may be set based on the requirements of the display panel, which is not limited here.

Figure 23:
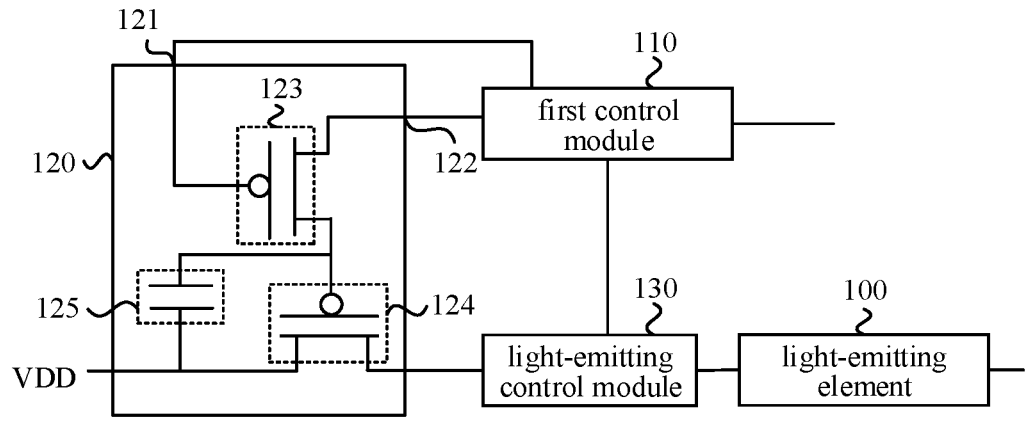
FIG. 23 shows a schematic structural diagram of a display panel according to an embodiment of the present disclosure.

In some embodiments, as shown in FIG. 23, the second control module 120 includes a switch control transistor 123, a driving transistor 124 and a storage capacitor 125. A control terminal of the switch control transistor 123 is connected to the scanning signal input terminal 121 of the second control module 120, a first terminal of the switch control transistor 123 is connected to the data signal input terminal 122 of the second control module 120, and a second terminal of the switch control transistor 123 is connected to a terminal of the storage capacitor 125 and a control terminal of the driving transistor 124. Another terminal of the storage capacitor 125 is connected to a first terminal of the driving transistor 124, and a second terminal of the driving transistor 124 is connected to the light-emitting control module 130.

The operation principle and operation process of the second control module 120 is described in detail later.

Exemplarily, the switch control transistor 123 and the driving transistor 124 may be thin film transistors (TFT), and active layers thereof may be made of low temperature poly-silicon. The switch control transistor 123 and the driving transistor 124 may be P-type transistors, as shown in FIG. 23. In other embodiments, the switch control transistor 123 and the driving transistor 124 may alternatively be N-type transistors, which are not limited here. The types of the switch control transistor 123 and the driving transistor 124 may be the same or different, which is not limited here.

Exemplarily, as shown in FIG. 23, both the switch control transistor 123 and the driving transistor 124 are PTFTs (P-type TFTs). The control terminal of the switch control transistor 123 is connected to the scanning signal input terminal 121, for receiving the scanning signals output by the first control module 110. The first terminal of the switch control transistor 123 is connected to the data signal input terminal 122, for receiving the data signal output by the first control module 110. By controlling the voltage value of the scanning signal and the voltage value of the data signal, the switch control transistor 23 is controlled to be on or off. When the switch control transistor 123 is in an on state, the control terminal of the driving transistor 124 is powered on, and the storage capacitor 125 is configured to keep a voltage of the control terminal of the driving transistor 124 constant within an image frame period. The first terminal of the driving transistor 124 is also connected to a power voltage terminal of the second control module 120, and is controlled to be on and off, according to the voltage of the control terminal of the driving transistor 124 and the power voltage of the second control module. When the driving transistor 124 is in an on state, the second control module 120 provides the driving current to the light-emitting element 100, and when the driving transistor 124 is in an off state, the second control module 120 does not provide the driving current to the light-emitting element 100.

In other embodiments, the second control module 120 may be other circuit structures capable of controlling the magnitude of the driving current, which is not limited herein.

Figure 24:
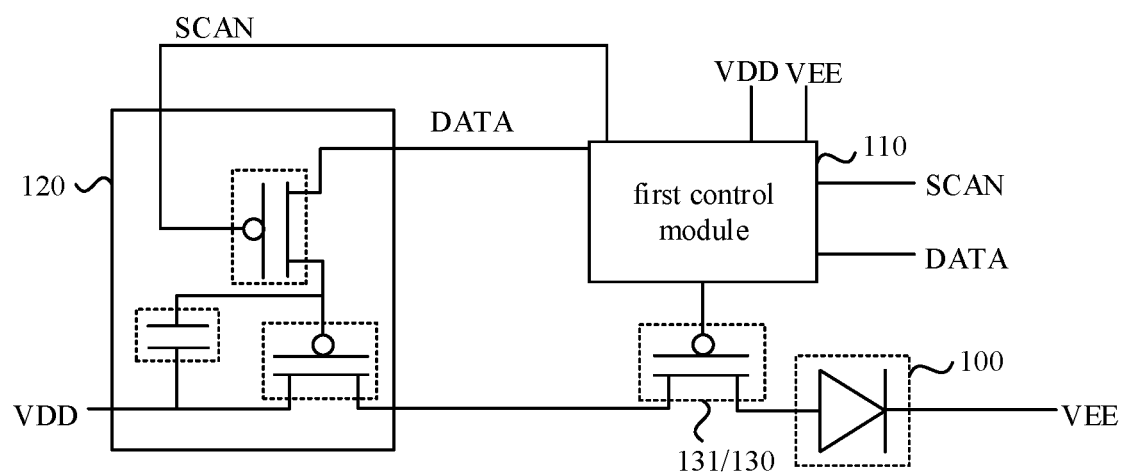
FIG. 24 shows a schematic structural diagram of a display panel according to an embodiment of the present disclosure.

In some embodiments, as shown in FIG. 24, in the display panel, the light-emitting control module 130 includes a low temperature poly-silicon thin film transistor (LTPS-TFT) 131.

Exemplarily, with reference to FIG. 23 and FIG. 24, a control terminal of the low temperature poly-silicon thin film transistor 131 is used as the control terminal of the light-emitting control module 130, and is connected to the first control module 110. A first terminal of the low temperature poly-silicon thin film transistor 131 is used as the first terminal of the light-emitting control module 130, and is connected to the second terminal of the driving transistor 124. A second terminal of the low temperature poly-silicon thin film transistor 131 is used as the second terminal of the light-emitting control module 130, and is connected to light-emitting element 100. In this way, the first control module 110 controls the light-emitting duration of the light-emitting element 100 by controlling the turn-on or turn-off of the low-temperature poly-silicon thin film transistor 131; and the second control module 120 controls a current passing through the low temperature poly-silicon thin film transistor 131 based on the driving signal (including the scanning the signal SCAN and data signal DATA) output by the first control module 110 and the power voltage, that is, controls the driving current provided for the light-emitting element 100.

In some embodiments, the driving signal includes a voltage corresponding to the scanning signal; an absolute value of the voltage of the scanning signal of the second control module 120 is greater than an absolute value of the power voltage of the first control module 110.

The power voltage of the first control module 110 includes a positive voltage VDD and a negative voltage VEE. In the embodiments, the relative magnitude of the absolute value of the power voltage is described.

Exemplarily, the absolute value of the power voltage of the first control module 110 is 3 V, and the corresponding voltage range is 0~±3 V, where the positive voltage VDD is +3 V, and the negative voltage VEE is −3 V. The absolute value of the voltage corresponding to the scanning signal is 8 V, which is greater than the absolute value 3 V of the power voltage of the first control module 110, where the corresponding positive voltage VDD is +8 V, and the corresponding negative voltage VEE is −8 V.

Exemplarily, the absolute value of the power voltage of the first control module 110 is 5 V, and the corresponding voltage range is 0~±5 V, where the positive voltage VDD is +5 V, and the negative voltage VEE is −5 V. The absolute value of the voltage corresponding to the scanning signal is 8 V, which is greater than 5 V, that is, the absolute value of the voltage corresponding to the scanning signal is greater than the absolute value of the power voltage of the first control module 110, where the corresponding positive voltage VDD is +8 V, and the corresponding negative voltage VEE is −8 V.

Figure 25:
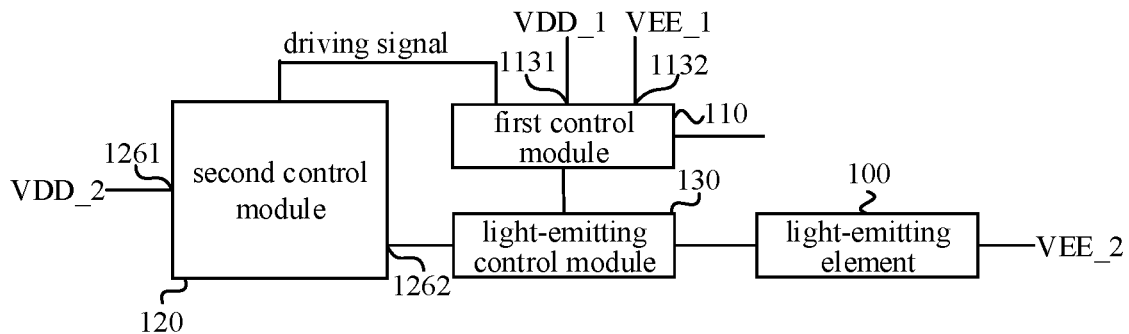
FIG. 25 shows a schematic structural diagram of a display panel according to an embodiment of the present disclosure.

In some embodiments, as shown in FIG. 25, the first control module 110 further includes a first power voltage input terminal 1131 and a second power voltage input terminal 1132, and the second control module 120 further includes a third power voltage input terminal 1261 and a fourth power voltage input terminal 1262. The first power voltage input terminal 1131 is configured to receive a first power voltage VDD_1 suitable for the first control module 110, and the second power voltage input terminal 1132 is configured to receive a second power voltage VEE_1 suitable for the first control module 110, the third power voltage input terminal 1261 is configured to receive a third power voltage VDD_2 suitable for the second control module 120, and the fourth power voltage input terminal 1262 is configured to receive a fourth power voltage VEE_2 suitable for the second control module 120. The first power voltage VDD_1 is greater than the second power voltage VEE_1, and the third power voltage VDD_2 is greater than the fourth power voltage VEE_2. The first power voltage VDD_1 is less than the third power voltage VDD_2, and the second power voltage VEE_1 is greater than the fourth power voltage VEE_2.

In an embodiment, the first power voltage VDD_1, the second power voltage VEE_1, the third power voltage VDD_2, and the fourth power voltage VEE 21 are fixed voltages. It should be noted that being fixed voltages represents the voltage values of the first power voltage VDD_1, the second power voltage VEE_1, the third power voltage VDD_2, and the fourth power voltage VEE_2 are fixed within one stage, but does not mean that the power voltages are always constant.

The power voltage includes a positive voltage VDD and a negative voltage VEE, the voltage value of the positive voltage VDD is positive, and the voltage value of the negative voltage VEE is negative. Therefore, the first power voltage VDD_1 is greater than the second power voltage VEE_1, and the third power voltage VDD_2 is greater than the fourth power voltage VEE_2. The absolute value of the power voltage of the second control module 120 is greater than the absolute value of the power voltage of the first control module 110, the first power voltage VDD_1 is less than the third power voltage VDD_2, and the second power voltage VEE_1 is greater than the fourth power voltage VEE_2. Exemplarily, a range of the power voltage of the first control module 110 is 0~±5 V, where the corresponding first power voltage VDD_1 is +5 V, and the corresponding second power voltage VEE_1 is −5 V; a range of the power voltage of the second control module 120 is 0~±8 V, where the corresponding third power voltage VDD_2 is +8 V, and the corresponding fourth power voltage VEE_2 is −8 V.

In some embodiments, the first control module 110 includes a monocrystalline silicon component, and the second control module 120 includes a low temperature poly-silicon component.

The first control module 110 includes a monocrystalline silicon component, and the second control module 120 includes a low-temperature poly-silicon component. Due to different component characteristics, the driving voltages required by the first control module 110 and the second control module 120 are different, and the power voltages of the first control module 110 and the second control module 120 are different, where the absolute value of the power voltage of the second control module 120 is greater than the absolute value of the power voltage of the first control module 110.

Figure 26:
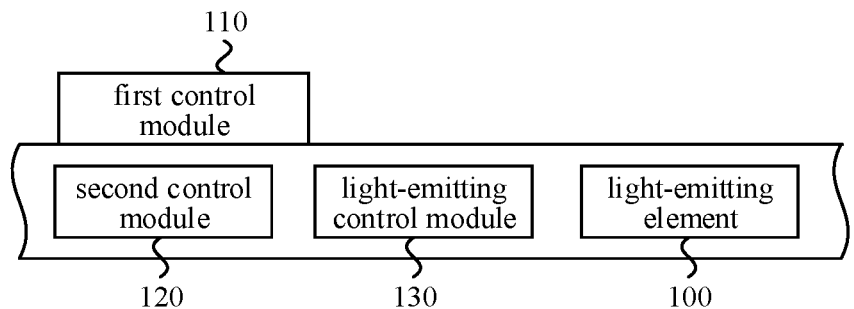
FIG. 26 shows a schematic structural diagram of a display panel according to an embodiment of the present disclosure.
Figure 27:
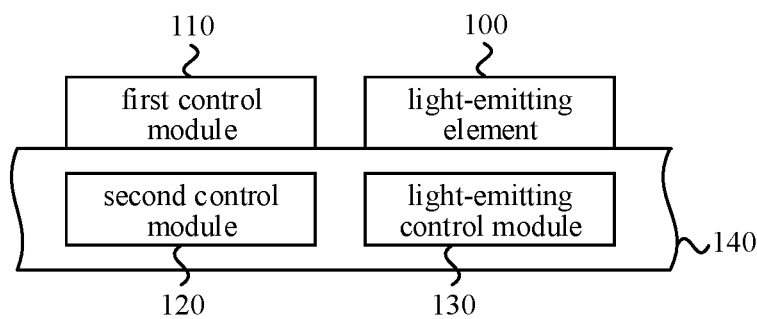
FIG. 27 shows a schematic structural diagram of a display panel according to an embodiment of the present disclosure.

In some embodiments, as shown in FIG. 26 and FIG. 27, the display panel further includes a substrate 140. The substrate 140 includes a second control module 120 and a light-emitting control module 130, and the first control module 110 and the substrate 140 are connected; the light-emitting element 100 is arranged in the substrate 140, or the light-emitting element 100 is connected to the substrate 140.

Exemplarily, as shown in FIG. 26, the second control module 120, the light-emitting control module 130 and the light-emitting element 100 are arranged in the substrate 140, and the first control module 110 is connected to the substrate 140.

Exemplarily, as shown in FIG. 27, the second control module 120 and the light-emitting control module 130 are arranged in the substrate 140, the first control module 110 is connected to the substrate 140, and the light-emitting element 100 is connected to the substrate 140.

It should be noted that, FIGS. 26 and 27 only exemplarily show a one-to-one correspondence between the first control module 110 and the second control module 120, where one first control module 110 outputs a scanning signal and/or data signal to one second control module 120, but does not constitute a limitation to the display panel according to the embodiments of the present disclosure.

In other embodiments, one first control module 110 may output the scanning signal and/or the data signal to at least two second control modules 120. Exemplarily, one first control module 110 may output the scanning signal to at least some of the second control modules 120 in the same row (for example, at least two second control modules as shown in FIG. 21); and/or, one first control module 110 may output the data signal to at least some of the second control modules 120 in the same column (for example, at least two second control modules as shown in FIG. 22), which is not limited here.

Figure 28:
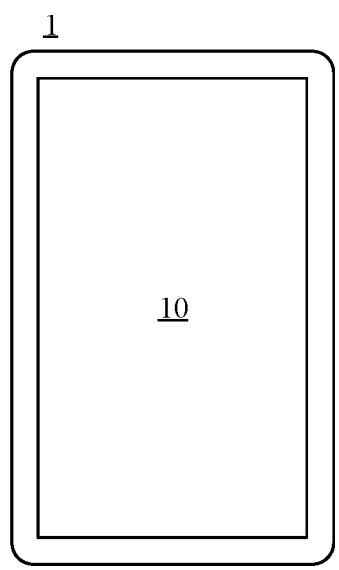
FIG. 28 shows a schematic structural diagram of a display device according to an embodiment of the present disclosure.

On the basis of the foregoing embodiments, a display device is further provided according to an embodiment of the present disclosure. Exemplarily, as shown in FIG. 28, the display device 1 includes the display panel 10 according to any of the above-described embodiments, and can achieve corresponding beneficial effects, which are not elaborated herein for brevity.

The display device includes, but is not limited to, a mobile phone, a tablet computer, a vehicle-mounted computer, a smart wearable device with a display function, and other structural components with a display function, which is not elaborated or limited here.

It should be noted that in the specification, terms such as "first" and "second" are intended to distinguish one entity or operation with one another, but do not necessarily indicate a specific order or sequence between these entities or operations. In addition, the terms "include", "contain" and any other variants mean to cover the non-exclusive inclusion, and a process, method, item, or device that includes a series of elements is not necessarily limited to those elements, but may include other elements not expressly listed or inherent to such a process, method, item, or device. Without further limitations, an element preceded by the statement "including a" does not exclude the existence of other same elements in the process, method, item, or device including the element.

What is claimed is:

1. A display panel, comprising:
   a light-emitting element, a first control module, a second control module and a light-emitting control module,
   wherein the first control module is connected to a control terminal of the light-emitting control module, the second control module is connected to a first terminal of the light-emitting control module, a second terminal of the light-emitting control module is connected to the light-emitting element,
   the first control module selectively controls a light-emitting duration of the light-emitting element, and the second control module selectively provides a driving current for the light-emitting element,
   wherein at least one of the first control module provides a driving signal to at least one of the second control module.

2. The display panel according to claim 1, wherein the first control module comprises a first-type first control module, and
   the first-type first control module is connected to the second control module, and is configured to perform voltage conversion to generate the driving signal suitable for the second control module.

3. The display panel according to claim 2, wherein the second control module comprises a first-type second control module, and
   the first-type second control module is connected to the first-type first control module, and is configured to provide a driving current for the light-emitting element in response to the driving signal provided by the first-type first control module.

4. The display panel according to claim 1, wherein the at least one of the first control module comprises at least one of a scanning signal output terminal and a data signal output terminal, and the at least one of the second control module comprises at least one of a scanning signal input terminal and a data signal input terminal; and the scanning signal output terminal is connected to the scanning signal input terminal, and the data signal output terminal is connected to the data signal input terminal, wherein the first control module is configured to obtain, by voltage boosting, a scanning signal for driving the second control module, output the scanning signal through the scanning signal output terminal, and transmit the scanning signal to the scanning signal input terminal of the second control module; and the first control module is configured to obtain, by voltage boosting, a data signal for driving the second control module, output the data signal through the data signal output terminal, and transmit the data signal to the data signal input terminal of the second control module.

5. The display panel according to claim 4, wherein the first control module comprises a power voltage input terminal and a logic signal input terminal;
the power voltage input terminal receives a power voltage suitable for the first control module, and the logic signal input terminal receives a digital driving signal suitable for the first control module; and
the first control module is configured to generate the driving signal suitable for the second control module based on the power voltage and the digital driving signal suitable for the first control module.

6. The display panel according to claim 5, wherein the first control module further comprises an internal logic control unit and a digital-to-analog conversion unit;
an input terminal of the internal logic control unit is connected to the power voltage input terminal, and another input terminal of the internal logic control unit is connected to the logic signal input terminal;
the digital-to-analog conversion unit is connected between the internal logic control unit and the data signal output terminal of the first control module; and
the digital-to-analog conversion unit is configured to convert at least one of the digital driving signal suitable for the first control module into at least one of the driving signal suitable for the second control module under the control of the internal logic control unit.

7. The display panel according to claim 6, wherein the digital driving signal comprises at least one of a first scanning signal and a first data signal;
the digital-to-analog conversion unit is configured convert, under the control of the internal logic control unit, the first data signal suitable for the first control module into a second data signal suitable for the second control module, and the internal logic control unit is configured to generate a second scanning signal suitable for the second control module based on the scanning signal and the power voltage; and the driving signal comprises at least one of the second scanning signal and the second data signal.

8. The display panel according to claim 7, wherein an output terminal of the internal logic control unit is connected to the scanning signal output terminal of the first control module.

9. The display panel according to claim 5, wherein the first control module further comprises an internal logic control unit, a boost unit, a level conversion unit, and an output buffer unit;
the boost unit is configured to boost the power voltage to obtain an intermediate voltage;
the level conversion unit is configured to convert the intermediate voltage into a to-be-processed voltage for the driving signal under the control of the internal logic control unit; and
the output buffer unit is configured to amplify the to-be-processed voltage to obtain the driving signal.

10. The display panel according to claim 9, wherein an input terminal of the boost unit is connected to the power voltage input terminal, an output terminal of the internal logic control unit is connected to an input terminal of the level conversion unit, an output terminal of the boost unit is connected to another input terminal of the level conversion unit, another output terminal of the boost unit is connected to an input terminal of the output buffer unit, an output terminal of the level conversion unit is connected to another input terminal of the output buffer unit, and an output terminal of the output buffer unit is connected to the scanning signal output terminal of the first control module.

11. The display panel according to claim 9, wherein the boost unit comprises a charge pump; the level conversion unit comprises a level converter; and the output buffer unit comprises a power amplifier.

12. The display panel according to claim 4, wherein one first control module is configured to provide the scanning signal to two second control modules; and one first control module is configured to provide the data signal to two second control modules.

13. The display panel according to claim 12, wherein the light-emitting element is arranged in rows and columns; at least one of second control modules in a same row is provided with the scanning signal by one first control module; and at least one of second control modules in a same column is provided with the data signal by one first control module.

14. The display panel according to claim 1, wherein the second control module comprises a switch control transistor, a driving transistor and a storage capacitor;
a control terminal of the switch control transistor is connected to a scanning signal input terminal of the second control module, a first terminal of the switch control transistor is connected to a data signal input terminal of the second control module;
a second terminal of the switch control transistor is connected to a terminal of the storage capacitor and a control terminal of the driving transistor; and
another terminal of the storage capacitor is connected to a first terminal of the driving transistor, and a second terminal of the driving transistor is connected to the light-emitting control module.

15. The display panel according to claim 1, wherein the light-emitting control module comprises a low temperature poly-silicon thin film transistor.

16. The display panel according to claim 1, wherein the driving signal comprises a voltage corresponding to a scanning signal, and an absolute value of the voltage of the scanning signal of the second control module is greater than an absolute value of a power voltage of the first control module.

17. The display panel according to claim 1, wherein the first control module further comprises a first power voltage input terminal and a second power voltage input terminal, and the second control module further comprises a third power voltage input terminal and a fourth power voltage input terminal;
the first power voltage input terminal is configured to receive a first power voltage suitable for the first control module, the second power voltage input terminal is configured to receive a second power voltage suitable for the first control module, the third power voltage input terminal is configured to receive a third power voltage suitable for the second control module, and the fourth power voltage input terminal is configured to receive a fourth power voltage suitable for the second control module;
the first power voltage is greater than the second power voltage, and the third power voltage is greater than the fourth power voltage; and
the first power voltage is less than the third power voltage, and the second power voltage is greater than the fourth power voltage.

18. The display panel according to claim 17, wherein the first control module comprises a monocrystalline silicon component, and the second control module comprises a low-temperature poly-silicon component.

19. The display panel according to claim 1, further comprising a substrate,
- wherein the substrate comprises the second control module and the light-emitting control module, and the first control module is connected to the substrate; and
- the light-emitting element is arranged in the substrate, or the light-emitting element is connected to the substrate.

20. A display device comprising a display panel, the display panel comprising:

a light-emitting element, a first control module, a second control module and a light-emitting control module, wherein the first control module is connected to a control terminal of the light-emitting control module, the second control module is connected to a first terminal of the light-emitting control module, a second terminal of the light-emitting control module is connected to the light-emitting elements, the first control module selectively controls a light-emitting duration of the light-emitting element, and the second control module selectively provides a driving current for the light-emitting element, wherein at least one of the first control module provides a driving signal to at least one of the second control module.

* * * * *